United States Patent [19]
Nakaoka

[11] Patent Number: 5,864,510
[45] Date of Patent: Jan. 26, 1999

[54] SEMICONDUCTOR MEMORY DEVICE HAVING A BIT COMPRESSED TEST MODE AND A CHECK MODE SELECTING SECTION

[75] Inventor: Yuji Nakaoka, Tokyo, Japan

[73] Assignee: NEC Corporation, Tokyo, Japan

[21] Appl. No.: 908,710

[22] Filed: Aug. 8, 1997

[30] Foreign Application Priority Data

Aug. 9, 1996 [JP] Japan .................................... 8-227775

[51] Int. Cl.$^6$ .................................................. G11C 7/00
[52] U.S. Cl. ............................................................ 365/201
[58] Field of Search .................................. 365/201, 233, 365/222, 185.09, 208

[56] References Cited

U.S. PATENT DOCUMENTS 5,511,029  4/1996  Sawada et al. ......................... 365/233
5,708,601  1/1998  McKenney et al. ..................... 365/201

Primary Examiner—David Nelms
Assistant Examiner—Thong Le
Attorney, Agent, or Firm—Foley & Lardner

[57] ABSTRACT

A semiconductor memory device is tested in a bit-compressed test mode wherein a plurality of banks of memory cells, which are disposed in association with respective I/O pins, are tested through one of the I/O pins. During the bit-compressed test mode, a check mode is additionally entered to examine whether the memory device actually stays in the bit-compressed test mode. The result of check by the check mode is supplied through the one of the I/Os pin delegating the plurality of I/O pins. The bit-compressed test mode is effected with accuracy.

3 Claims, 11 Drawing Sheets

SEMICONDUCTOR MEMORY DEVICE HAVING A BIT COMPRESSED TEST MODE AND A CHECK MODE SELECTING SECTION

BACKGROUND OF THE INVENTION (a) Field of the Invention

The present invention relates to a semiconductor memory device, and in particular, to a semiconductor memory device capable of being tested with a correct test mode.

(b) Description of the Related Art

DRAM (dynamic random access memory) increases its storage capacity four fold with each new generation. Then, it follows that if the number of I/O (input/output) units remains unchanged, the time length required to access all the memory cells in the memory device also increases by factor of four at each generation change. To avoid the delay for the access time, a x16 product is developed and commercially available which has 16 I/O pins to be accessed at one time for read/write operation compared to four I/O pins in the conventional x4 products. This permits the access time for all the memory cells to be unchanged between the x4 products and the x16 products. This also allows a screening test time for the memory products to be substantially reduced by a quadrature factor for x16 products than for x4 products having the same storage capacity.

However, in consideration that the memory tester generally has a number of read-out comparators depending on the number of products which can be simultaneously tested, if a x16 product tester contains the same number of comparators as for a x4 product tester, it follows that the number of memory devices which can be tested simultaneously is reduced by a factor of four for the x16 products than for the x4 products, thereby degrading the efficiency in the product screening test.

A bit-compressed test mode is recently proposed which prevents such degradation in the screening test by using a single I/O pin in read-write operation of data for four I/O pins among sixteen I/O pins, for example. An example of conventional circuit arrangements of semiconductor memory device operating in such a bit-compressed test mode is shown in FIG. 1.

In FIG. 1, it is to be noted that the arrangement of data-in buffers DIB1–DIB4 and data-out buffers DOB1–DOB4 which are associated with I/O pins IO1–IO4 have different configurations: the arrangement of data-in buffer DIB2 and data-out buffer DOB2 for IO2 pin is different from the arrangement for the remainder of data-in buffers DIB1, DIB3 and DIB4 and data-out buffer DOB1, DOB3 and DOB4, respectively, for I/O pins IO1, IO3 and IO4. In addition, NAND gates NA901–NA903 are provided for four banks of memory cells in the memory device to provide test result signal TFAILB through IO2 pin.

FIGS. 2 to 5 show circuit configurations of data-out buffers DOB1, DOB3 and DOB4, data-out buffer DOB2, data-in buffers DIB1, DIB3 and DIB4, and data-in buffer DIB2, respectively. In these drawings, as in the rest of the drawings, characters INV, NA, QN, QP, TG, NO and N attached to numerals show that those elements are inverter, NAND gate, N-ch MOSFET, P-ch MOSFET, transfer gate, NOR gate and signal node, respectively.

Referring to FIG. 2, each of data-out buffers DOB1, DOB3 and DOB4 has an inverter INV201 receiving TEST signal for effecting a bit-compressed test mode, a NAND gate NA201 receiving an output from INV201, data from bus RWBSTi (I=1,3 or 4) and output-enable signal OE, a NAND gate NA202 receiving an output from INV201, data from bus RWBSNi (1=1, 3 or 4) and output enable signal OE, inverters INV202 and INV203 receiving outputs from NA201 and NA202, respectively, and a pair of serial N-ch MOSFETs QN201 and QN202 receiving outputs from INV202 and INV203, respectively, at respective gates thereof, for supplying output signal to IOi pin (I=1, 3 or 4) through the node connecting the MOSFETs QN201 and QN202.

Referring to FIG. 3, data-out buffer DOB2 in FIG. 1 is similar to data-out buffers DOB1, DOB3 and DOB4 shown in FIG. 2 except that a test result signal TFAILB showing the occurrence of a failure in the read out data is used instead of TEST signal, and data from bus pair RWBST2 and RWBSN2 are used instead of data from bus pair RWBSTi and RWBSNi (I=1, 3 or 4), respectively.

Referring to FIGS. 4 and 5, data from Ioi pin (i=1 to 4) is supplied to respective data bus pairs RWBSTi/RWBSNi, as will be detailed below.

FIG. 6 shows a timing chart during a bit-compressed test mode in the memory device of FIG. 1. To enter a bit-compressed test mode from a mode, other than a test mode, which enables a normal write/read operation, a WCBR (WEB CASB Before RASB) cycle, which was standardized from 4 Mbit DRAMs, is effected while simultaneously supplying a predetermined specific key input to address key-input pins (A3, A4 and A5 pins in FIG. 1). At this time, no super-voltage (for example, 10 volts) which exceeds a normal voltage of 5 volts is applied to SVT (super-voltage pin, A0 in FIG. 1).

FIG. 6 illustrates write/read cycles during the bit-compressed test mode. Initially, RASB (row address strobe) is made low to accept a row address, and then CASB (column address strobe) is made low to accept a column address. WEB (write enable) is also made low, allowing W0 signal to turn from low to high to provide a single shot of W0 signal, whereby the first stage of IOi (where i=1 to 4) is enabled to accept write-in data or data to be written.

In the bit-compressed test mode, four I/O pins IO1 to IO4 are delegated by a single I/O pin (IO2, in this example) to achieve a bit-compressed test mode. Accordingly, it is only necessary that IO2 pin accepts data to be written, and it does not matter if other IOi pins (where i=1, 3 and 4) stay at a high impedance state (Hi-Z).

Referring to FIG. 4 which shows the circuit arrangement of data-in buffers DIB1, DBI3 and DIB4, even if W0 turns high to enable NAND gate NA403 to pass data from Ioi pin, transfer gate TG402 remains off because TEST signal remains high (and therefore an output from NOR gate N0401 is low ). Thus, written-in data which is fed from IOi pin (where i=1, 3 or 4) is not accepted. Instead, The inverted signal of data DIN2N, which is accepted by transfer gate 501 in data-in buffer DIB2 shown in FIG. 5 associated with IO2 pin, is fed through transfer gate TG401 in data-in buffer DIBi in FIG. 4 which is turned on by TEST signal.

Subsequently, W1 signal turns from low to high, whereby transfer gate TG501 (see FIG. 5) in data-in buffer DIB2 is turned off, allowing the accepted data to be latched by a flipflop formed by inverters INV504 and INV505. Thereafter, W2 signal turns from low to high, whereupon read/write bus pairs RWBSNi/RWBSTi for data-in buffer DIBi (where i=1, 3 and 4) shown in FIG. 4 and read/write bus pair RWBSN2/RWBST2 for data-in buffer DIB2 in FIG. 5 are driven in accordance with the same write-in data fed from IO2 pin. Accordingly, write amplifiers 105 shown in FIG. 1 drives data line pairs IOTi/IONi (where i=1, 2, 3 and 4) for writing the same data into respective memory cells in the four banks.

Now, the read cycle of the bit-compressed test mode will be described. As in the write cycle, RASB assumes low and then CASB assumes low to allow read-out addresses to be accepted. Data stored in memory cells at these addresses for four I/O pins are read out onto data line pairs IONi/IOTi (where i=1, 2, 3 and 4), whereby data amplifiers 104 drive respective bus pairs RWBSNi/RWBSTi (where i=1, 2, 3 and 4).

During the bit-compressed test mode of this example, a read/write operation occurs with the same data for four I/O pins, and hence data read out onto bus pairs RWBSTi/RWBSNi (where i=1, 2, 3 and 4) are equal to each other.

In FIG. 1, when data, all of which are equal to each other, are read out, either output from NAND gate NA901 or NA902 is low independently of whether the data read out are equal to 0 or 1, and hence the test result signal TFAILB from NAND gate NA903 remains high. In this case, it is known from the high level of TFAILB signal that equal data is read out for four IO pins. Referring to FIG. 3 which shows the circuit arrangement of data-out buffer DOB2 associated with pin IO2, data on bus pair RWBST2/RWBSN2 delegates the four data, and if output enable OEB is low and signal OE which is a complimentary signal of OEB is high, read-out data is delivered to IO2 pin. Specifically, in FIG. 3, when TFAILB signal assumes high and OE signal assumes high, NAND gate NA1001/NA1002 delivers an inverted signal of the complimentary signal from bus pair RWBST2/RWBSN2, which is again inverted in an inverter INV1001/INV1002 to feed N-ch transistor QN1001/QN1002, thereby delivering a voltage equivalent to the logic value of RWBST2 from IO2 pin.

In the data-out buffer DOBi for the remaining IOi (where I=1, 3 or 4) shown in FIG. 2, because TEST signal is high, an output from NAND gate NA201/NA202 which receives TEST and OE signals and data from corresponding bus pair RWBSTi/RWBSNi assumes a high level even if the signal OE is high. Accordingly, an output from inverter INV202/INV203 assumes a low level. In this state, N-ch transistors QN201 and QN202 are both turned off, and an output at IOi pin (i=1, 3 or 4) remains at its high impedance state(Hi-Z).

On the other hand, if one of data read out from bus pairs RWBSTi/RWBSNi (where i=1 to 4) is different from other data, TFAILB signal assumes low. Thus, as understood from FIG. 3, an output from NAND gate NA1001/NA1002 which receives TEST and OE signals and data from RWBST2/RWBSN2 assumes a high level, and N-ch transistors QN1001 and QN1002 are both turned off, resulting in an output of Hi-Z through IO2 pin, indicating the occurrence of a failure.

In the event that although the outputs for all the I/O pins (IO1 to IO4) are equal, and yet the data itself is wrong, a failure is detected by the fact that data delivered from IO2 pin is different from an expected value.

In the manner as described above, a read/write operation of data for four I/O pins IO1 to IO4 which are compressed into a single I/O pin is performed.

In the conventional semiconductor memory device described above, it is generally considered sufficient that attention be paid only to IO2 pin during the bit-compressed test mode. However, if the screening test is effected by paying attention only to IO2 pin, a product or products maybe erroneously determined as acceptable in the event that they pass a test effected for IO2 pin even if the product or products to be screened are involved with some defect in the memory device or other reason which prevents them from entering the bit-compressed test mode. Thus, a problem occurs that bank for the IO1, IO3 and IO4 pins may not be properly tested.

SUMMARY OF THE INVENTION

In view of the foregoing, it is an object of the present invention to provide a semiconductor memory device having an improved test mode wherein failed products can be detected accurately.

The present invention provides a semiconductor memory device comprising a test mode selecting section for allowing the semiconductor memory device to enter a test mode for testing the semiconductor memory device, a check mode selecting section for allowing the semiconductor memory device to enter a check mode without exiting the test mode, the check mode examining whether or not the semiconductor memory device stays in the test mode, and an output section for outputting a check signal representing a result of the examination by the check mode.

In accordance with the semiconductor memory device according to the present invention, whether or not the semiconductor memory device stays in the test mode can be detected, with the consequence that an accurate test can be effected while maintaining the semiconductor memory device in the test mode.

In a preferred embodiment of the present invention, CHECK signal, or a signal for determining whether or not the semiconductor memory device stays in a bit-compressed test mode is supplied from the output section without exiting from the test mode itself. The CHECK signal is fed to a delegating data-out buffer (such as data-out buffer DOB2 in FIG. 2) so as to be delivered through the delegating I/O pin (such as IO2 in FIG. 1), thereby permitting a examination whether or not the bit-compressed test mode is actually entered to avoid a failure occurring from the defect in the circuit for the bit-compressed test mode or other reason.

The above and other objects, features and advantages of the present invention will be more apparent from the following description, referring to the accompanying drawings.

DESCRIPTION OF THE PREFERRED EMBODIMENTS

Figure 1:
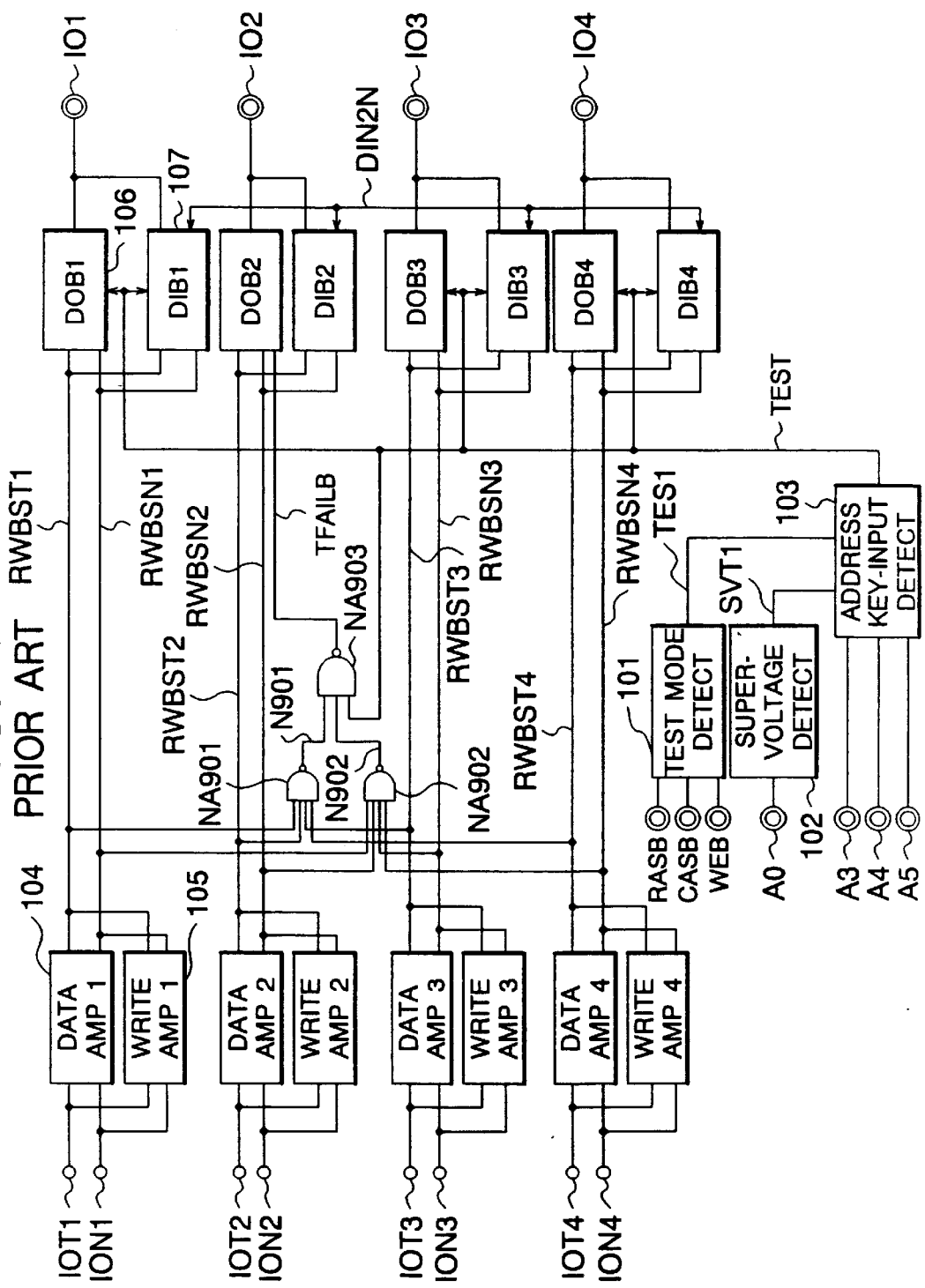
FIG. 1 is a block diagram of combination of a read/write section and an I/O section of a conventional semiconductor memory device.

Now, the present invention is more specifically described with reference to accompanying drawings, wherein similar constituent elements are designated by the same or similar reference characters.

Figure 7:
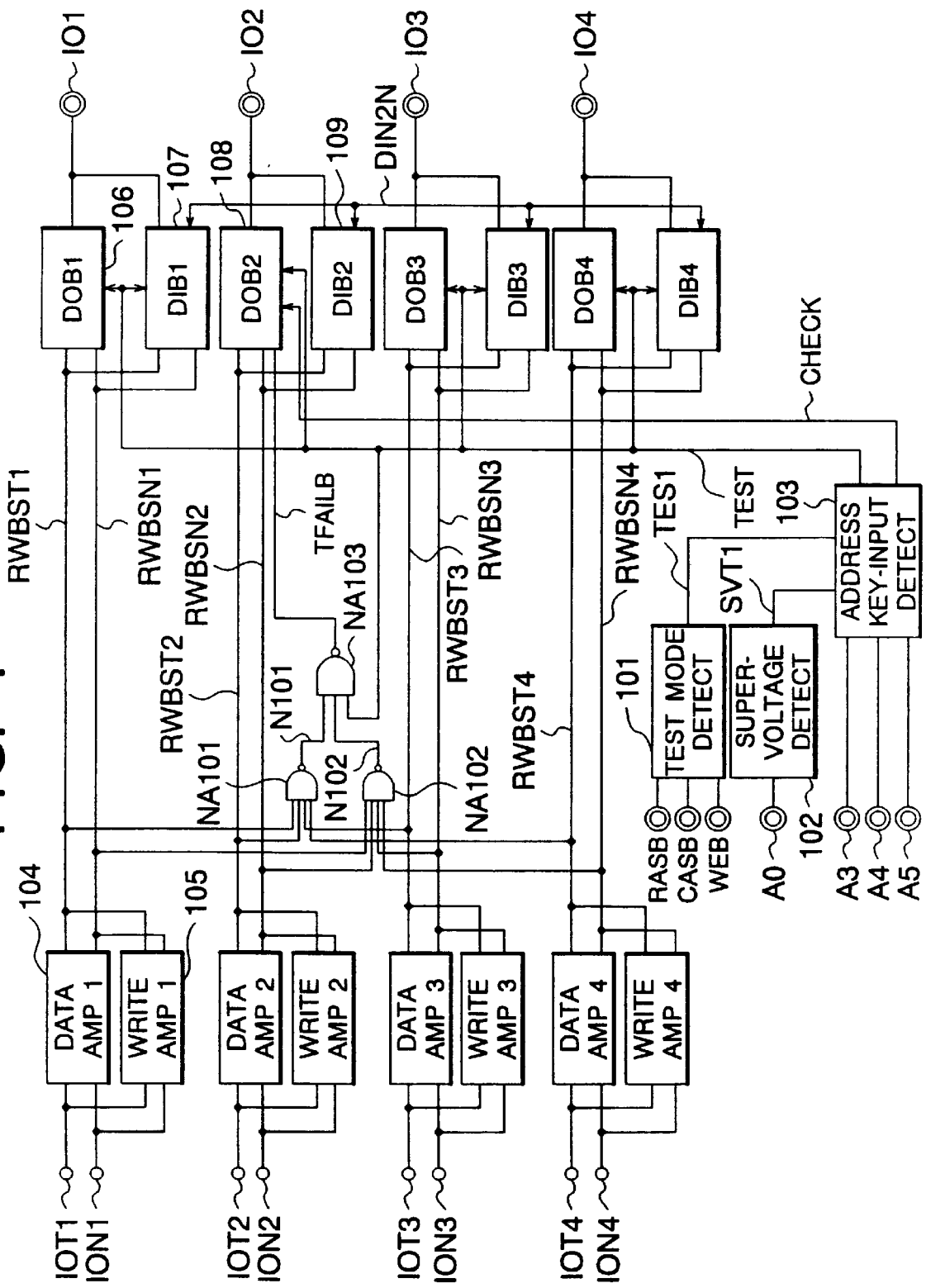
FIG. 7 is a block diagram of a combination of a read/write section and an I/O section of a semiconductor memory device according to a first embodiment of the present invention.

Referring to FIG. 7 showing a combination of a read/write section and an I/O section of a semiconductor memory device according to an embodiment of the present invention, each i-th (i=1, 2, 3 or 4) unit for one of four banks of the memory device comprises an amplifier pair including a data amplifier 104 for amplifying read-out data, bus pair RWBSTi/RWBSNi for data transfer, and a write amplifier 105 for amplifying write-in data and a buffer pair including a data-out buffer 106 and a data-in buffer 107, which are consecutively disposed between data line pair IOTi/IONi for a i-th bank of memory cells and a corresponding I/O pin Ioi. The second unit disposed for IO2 pin additionally comprises a NAND gate NA101 receiving four inputs from buses RWBST1 to RWBST4, a NAND gate NA102 receiving four inputs from buses RWBSN1 to RWBSN4, a NAND gate NA103 receiving outputs from NA101 and NA102 to supply a test result signal TFAILB to data-out buffer DOB2 disposed for IO2 pin.

The memory device further comprises, for effecting a bit-compressed test mode and a check mode, a test mode detecting section 101 receiving row address strobe (RASB), column address strobe (CASB) and write enable signal (WEB) to generate TES1 signal, a super-voltage detecting section 102 receiving an excess high voltage signal through A0 pin to generate SVT1 signal, and an address key-input detecting section (or decoder) 103 receiving signals through A3 to A5 pins from an operator, in addition to TES1 and SVT1 signals, to generate TEST signal for effecting a test mode for the semiconductor memory device and CHECK signal for assuring whether the memory cell stays in the bit-compressed test mode. TEST signal is supplied to data-out buffers DOBi (i=1 to 4) and data-in buffers DIBi (i=1, 3 and 4), whereas CHECK signal is supplied only to data-out buffer DOB2. CHECK signal can be generated by the address key-input detecting section 103 without canceling TEST signal.

Figure 2:
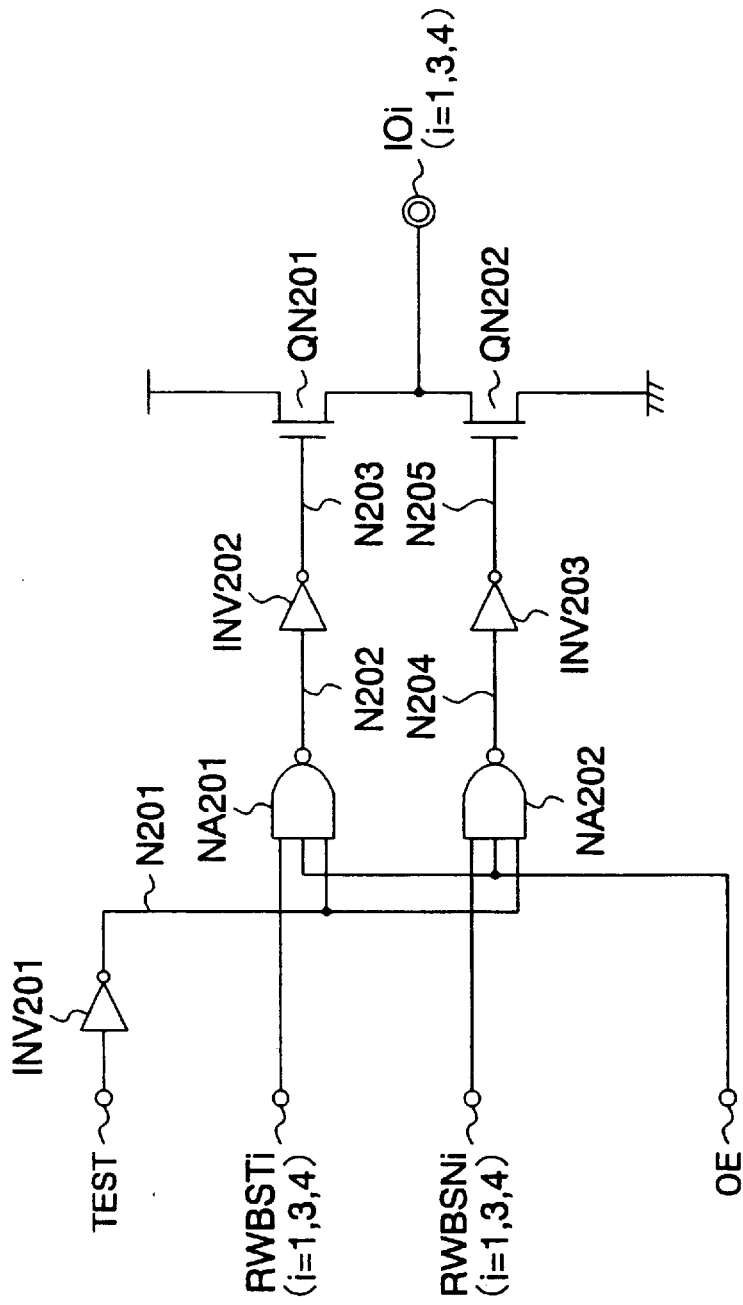
FIG. 2 is a circuit diagram of data-out buffer DOBi (I=1, 3 or 4) in FIG. 1 and also in FIG. 7.

The configuration of data-out buffers DOBi (i=1, 3 and 4) is shown in FIG. 2. Each of data-out buffers DOB1, DOB3 and DOB4 has an inverter INV201 receiving TEST signal, a NAND gate NA201 receiving an output from INV201, data from bus RWBSTi (I=1, 3 or 4) and output-enable signal OE, a NAND gate NA202 receiving an output from INV201, data from bus RWBSNi (I=1, 3 or 4) and output enable signal OE, inverters INV202 and INV203 receiving outputs from NA201 and NA202, respectively, and a pair of N-ch MOSFETs QN201 and QN202 receiving outputs from INV202 and INV203, respectively, at respective gates thereof, for supplying output signal to IOi pin (I=1, 3 or 4) at the node between the MOSFETs QN201 and QN202.

Figure 8:
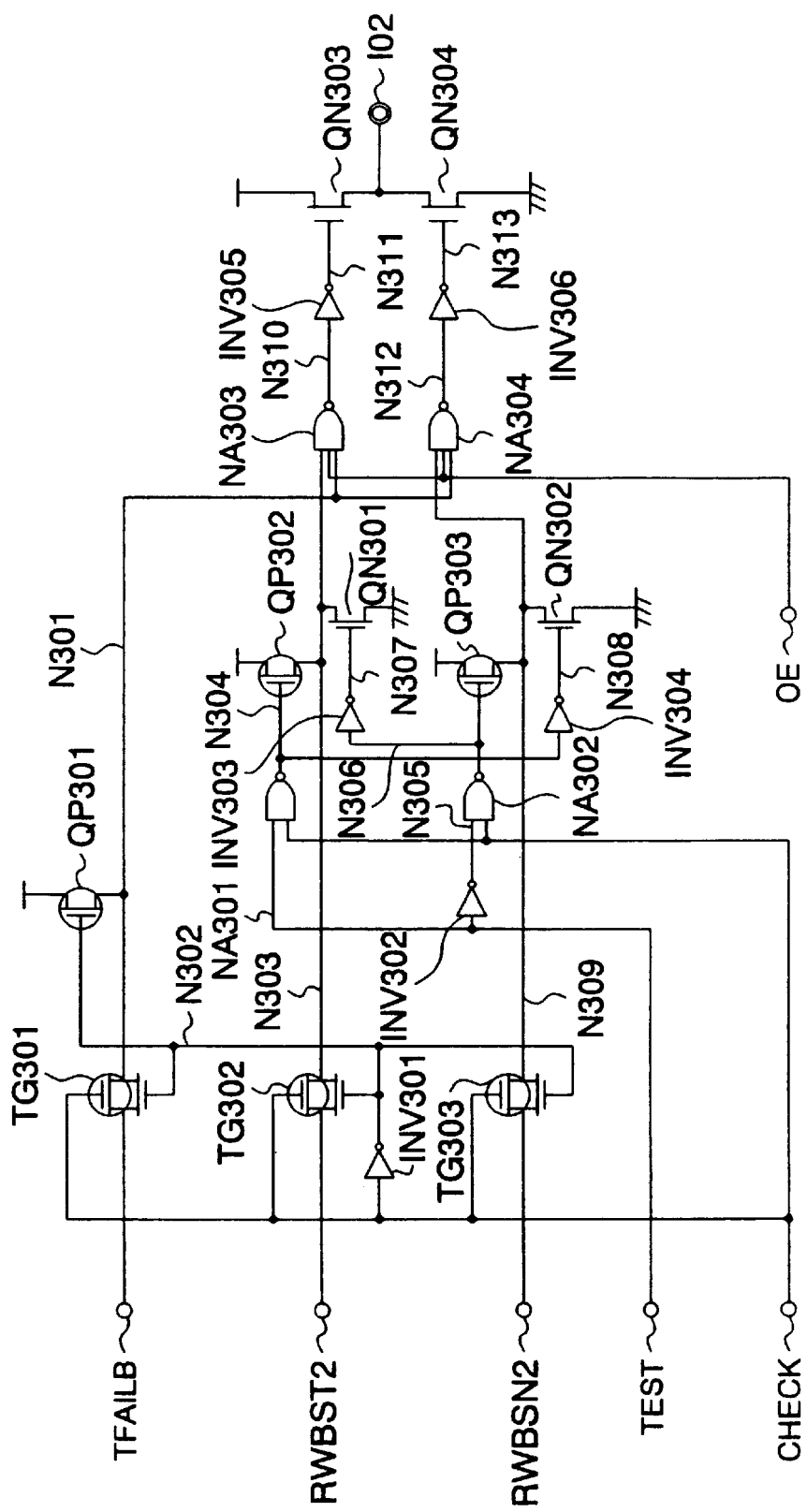
FIG. 8 is a circuit diagram of data-out buffer DOB2 used in FIG. 7.

Referring to FIG. 8, data-out buffer DOB2 in FIG. 7 comprises NAND gates NA303 and NA304 which receive TFAIL signal, an output enable signal OE and data from bus pair RWBST2/RWBSN2, inverters INV305 and INV306 which receive outputs from NAND gates NA303 and NA304, respectively, and serial N-ch transistors QN303 and QN304 in an output stage which receives outputs from the inverters INV305 and INV306, respectively, at the gates thereof. In addition, transfer gates TG301, TG302 and TG303 controlled by CHECK signal are connected in the signal paths of TFAILB signal, buses RWBST2 and RWBSN2, respectively.

A P-ch transistor QP301 receiving an inverted signal of CHECK signal at the gate thereof is connected between a source line and an output node N301 of the transfer gate TG301 which receives TFAILB signal as an input. A P-ch transistor QP302 which receives, at its gate input, an output from NAND gate NA301 receiving CHECK and TEST signals is connected between the source line and an output node N303 of the transfer gate TG302, which receives data from RWBST2. An N-ch transistor QN301 which receives, at its gate input, an output from NAND gate NA302 receiving inverted signals of CHECK and TEST signals is connected between an output node N303 of the transfer gate 302 and the ground. A P-ch transistor QP303 which receives, at its gate input, an output from NAND gate NA302 receiving inverted signals of CHECK and TEST signals is connected between the source line and an output node N309 of the transfer gate TG303, which receives data from RWBSN2. An N-ch transistor QN302 which receives, at its gate input, an output from NAND gate NA301 which receives CHECK and TEST signals is connected between the output node N309 of the transfer gate T303 and the ground. A three-input NAND gate NA303 receives inputs from nodes 301 and 303 and OE signal, and a three-input NAND gate NA304 receives inputs from nodes 301 and 309 and OE signal.

Figure 4:
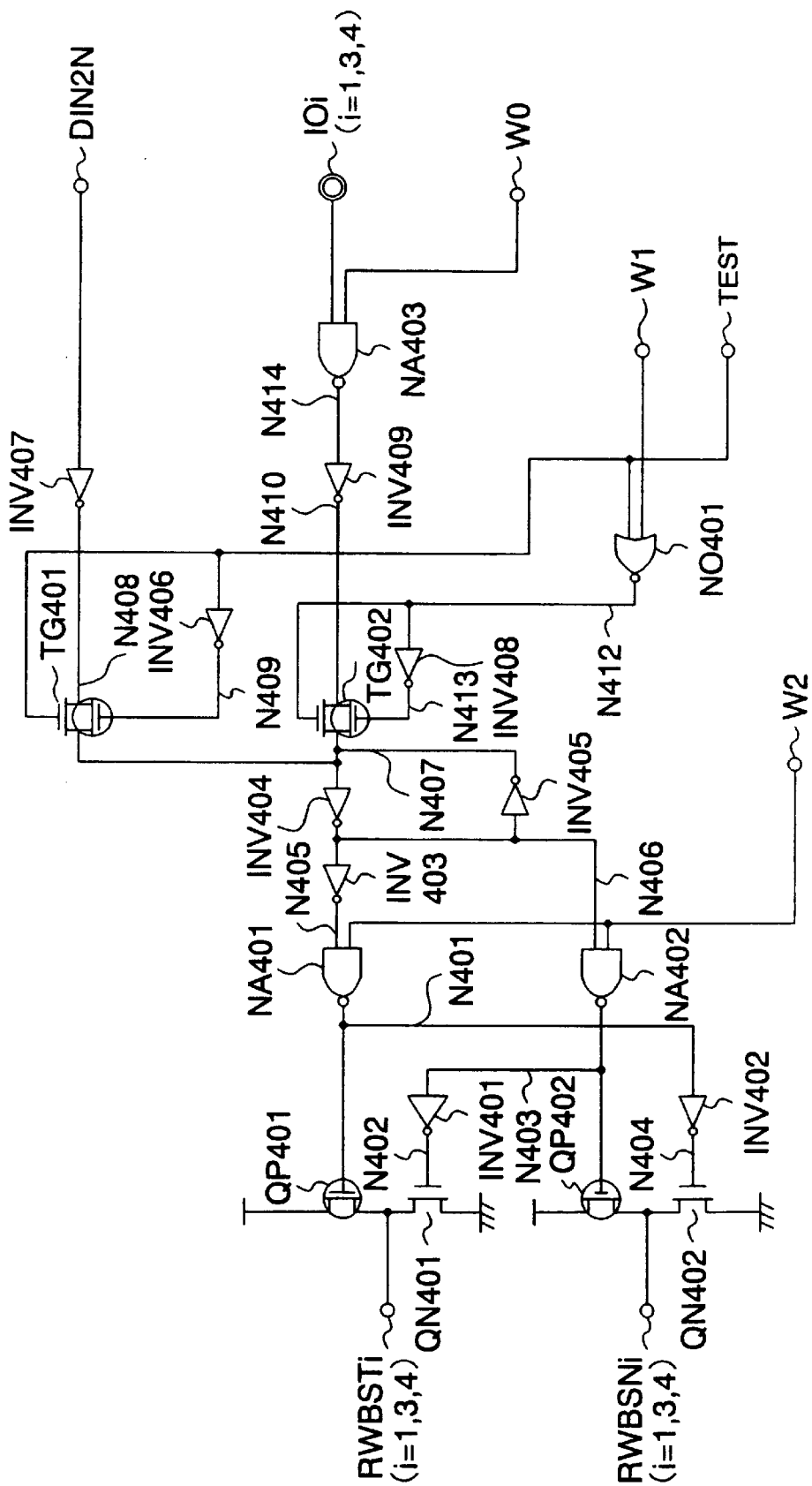
FIG. 4 is a circuit diagram of data- in buffer DOBi (I=1, 3 or 4) in FIG. 1 and also in FIG. 7.
Figure 5:
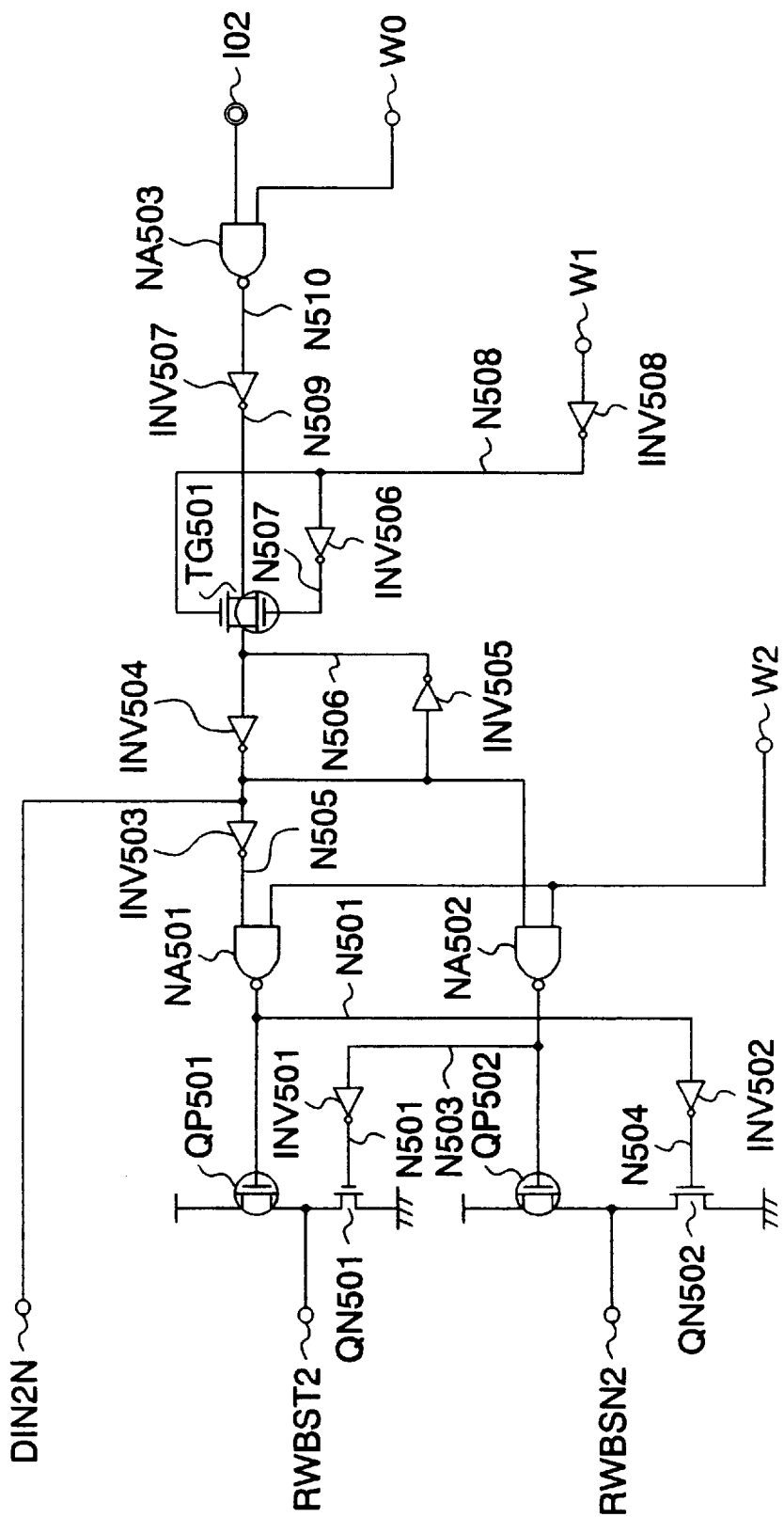
FIG. 5 is a circuit diagram of data-in buffer OIB2 in FIG. 1 and also in FIG. 7.
Figure 6:
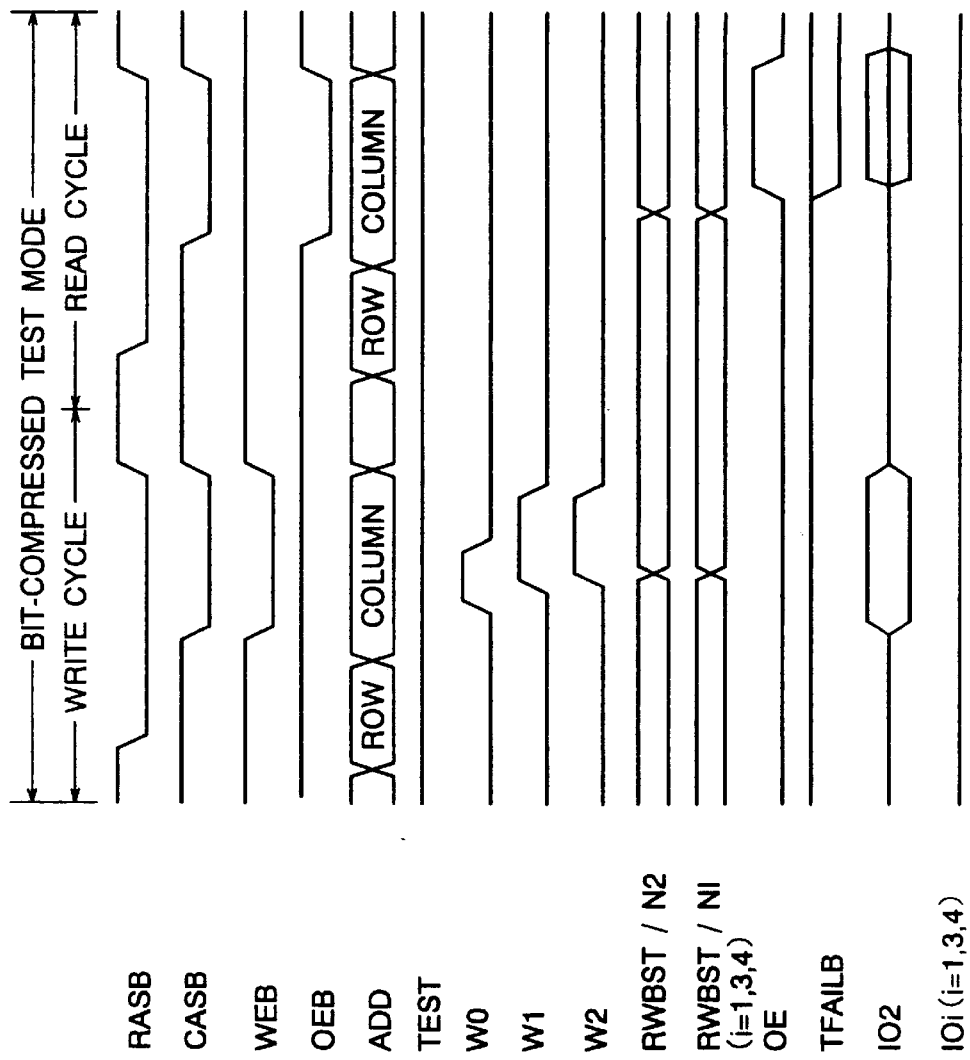
FIG. 6 is a timing chart for the memory device of FIG. 1.

The configurations of the data-in buffers DIB1, DOB3 and DOB4 are similar to those shown in the conventional memory device, as described with reference to FIGS. 4, and configuration of data-in buffer DIB2 is similar to that in the conventional memory device shown in FIG. 5.

In the above configurations, the memory device of the present embodiment differs from the prior art shown in FIG. 1 in that CHECK signal is input to data-out buffer DOB2 from the address key-input detecting section 103, in addition to TEST signal and in the arrangement, to be described below, of data-out buffer DOB2 for the delegating pin IO2.

The operation of the present embodiment will be described with reference to a timing chart shown in FIG. 9. Initially, to enter the bit-compressed test mode, a WCBR cycle is effected in the similar manner as in the prior art, and a predetermined specific address is input by an address key-input through pins A3, A4 and A5, without applying a super-voltage to the pin SVT or A0.

Figure 9:
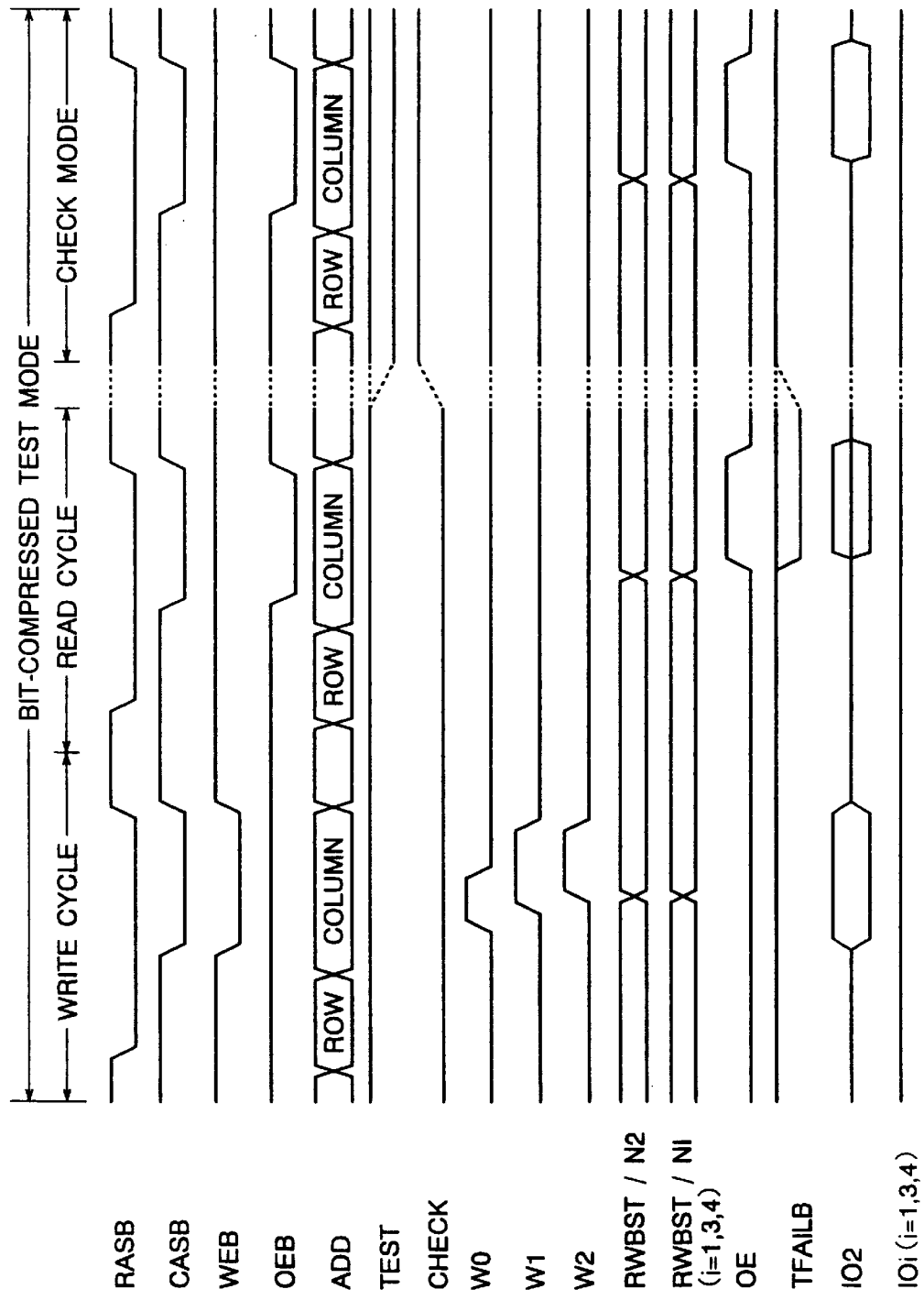
FIG. 9 is a timing chart illustrating the operation of the semiconductor memory device of FIG. 7.

FIG. 9. illustrates write and read cycles after the bit-compressed test mode is entered and a check cycle in the bit-compressed test mode. As in the prior art, RASB is made low to accept a row address, then CASB is made low to accept a column address. During the address latch cycle, CHECK signal remains low. The compressed I/O unit is delegated by 102 pin in the similar manner as in the prior art. A write cycle of the bit0-compressed test mode is effected similarly to the prior art.

A read cycle of the bit-compressed test mode in the present embodiment will be now described. Since CHECK signal assumes low in the read cycle, the circuit arrangement in this cycle of data-in buffer DIB2 shown in FIG. 8 is basically similar to that of the prior art shown in FIG. 3 assuming that the transfer gates TG301–TG303 are on while the transistors QP301–QP302 and QN301–QN302 are off.

Accordingly, if the data read out-from all of buses RWBST/RWSBNi (where i=1 to 4) remains the same, TFAILB signal remains high, and the data is delivered to IO2 pin. If one of the data which is read out from RWBST/

RWSBNi (where i=1 to 4) is different from others, TFAILB signal assumes low, whereupon an output from IO2 pin assumes Hi-Z, thereby allowing a determination whether the product passed or failed the test.

In the manner as described above, a read/write operation can be effected by using a single delegate pin IO2 for four I/O units.

In order to determine by observing only IO2 pin whether or not the bit-compressed test mode is actually entered, the semiconductor memory device enters another test mode or CHECK mode. The circuit arrangement of the present embodiment is modified from the conventional arrangement such that performing the WCBR cycle while applying the super-voltage allows the memory device to enter CHECK mode without exiting the bit-compressed test mode. Specifically, responding to the address key input from an operator, the memory device can enter CHECK mode without exiting the bit-compressed test mode. This is obtained by making CHECK signal high while maintaining TEST signal high.

When CHECK signal turns high, transfer gates TG301–TG303 in FIG. 8 are turned off, and P-ch transistor QP301 is turned on, turning the node 301 high. Since TEST signal remains high at this time, it follows that the nodes N304 and N307 are low while the nodes N306 and N308 are high, whereby transistors QP302 and QN302 are turned on while transistors QP303 and QP301 are turned off, turning the node N303 high and the node N309 low.

Since the node N301 remains high, when CASB turns low and OEB turns low, the signal OE turns from low to high, whereby high data is delivered to IO2 pin. Conversely, if TEST signal is low, the node N303 assumes low while the node N309 assumes high, thereby delivering low data to IO2 pin. In this manner, the use of CHECK mode allows a determination whether the product has actually entered the bit-compressed test mode by paying attention only to IO2 pin.

Figure 10:
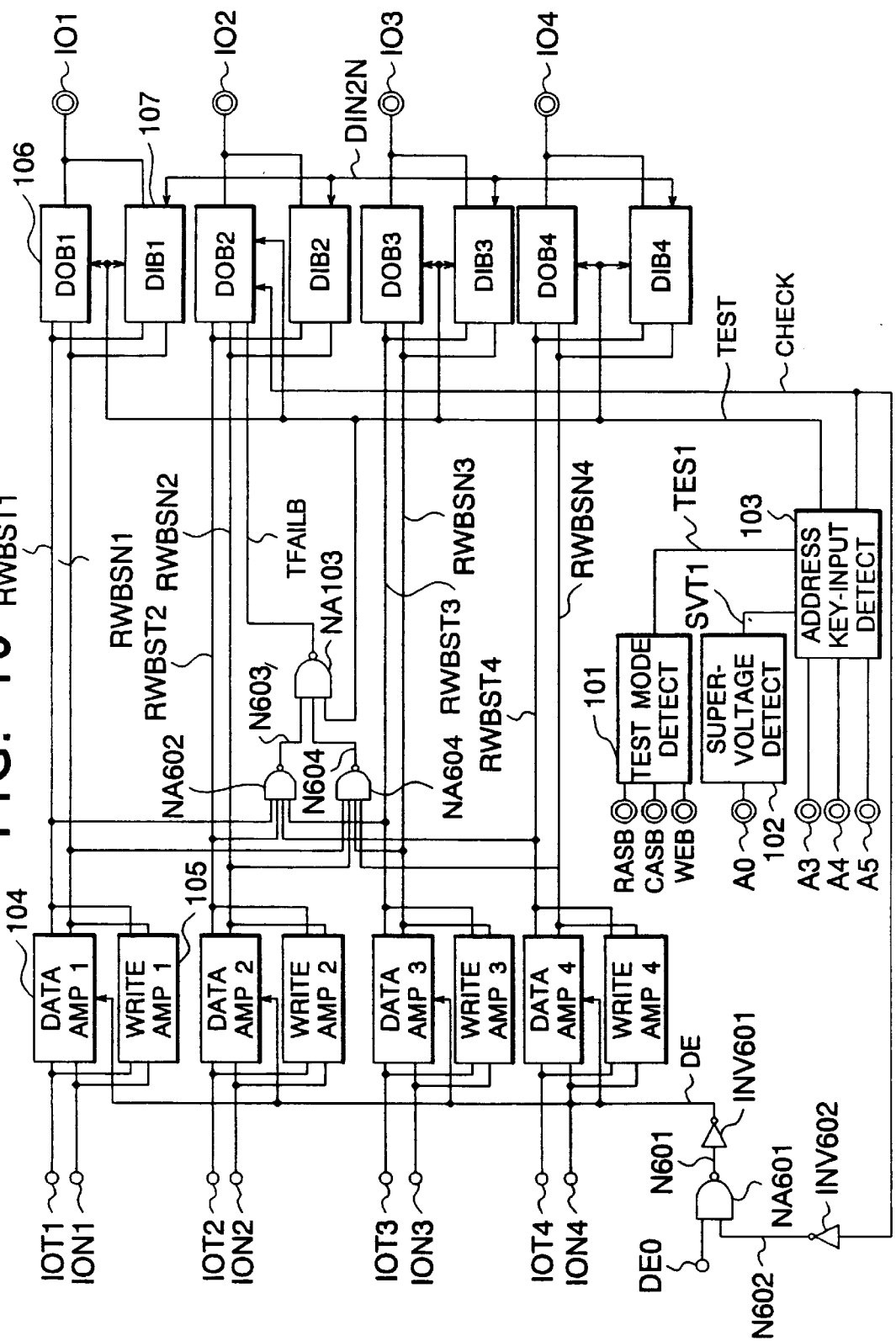
FIG. 10 is a block diagram of a combination of a read write section and an I/O section of a semiconductor memory device according to a second embodiment of the present invention.

Referring to FIG. 10, a memory device according to a second embodiment is similar to the first embodiment except that a NAND gate NA601, which receives a data enable signal DE0 and an inverted signal of CHECK signal supplied from the address key-input detecting section 403, and an inverter INV601 generate a data amplifier enable signal DE for activating data amplifiers 104 each of which receives data from corresponding bus pair IOTi/IONi. The circuit arrangement of data-out buffers DOB1, DOB3 and DOB4 is shown in FIG. 2, the circuit arrangement of data-in buffers DIB1, DIB3 and DIB4 is shown in FIG. 4, and the circuit arrangement of data-in buffer DIB2 is shown in FIG. 5.

Figure 11:
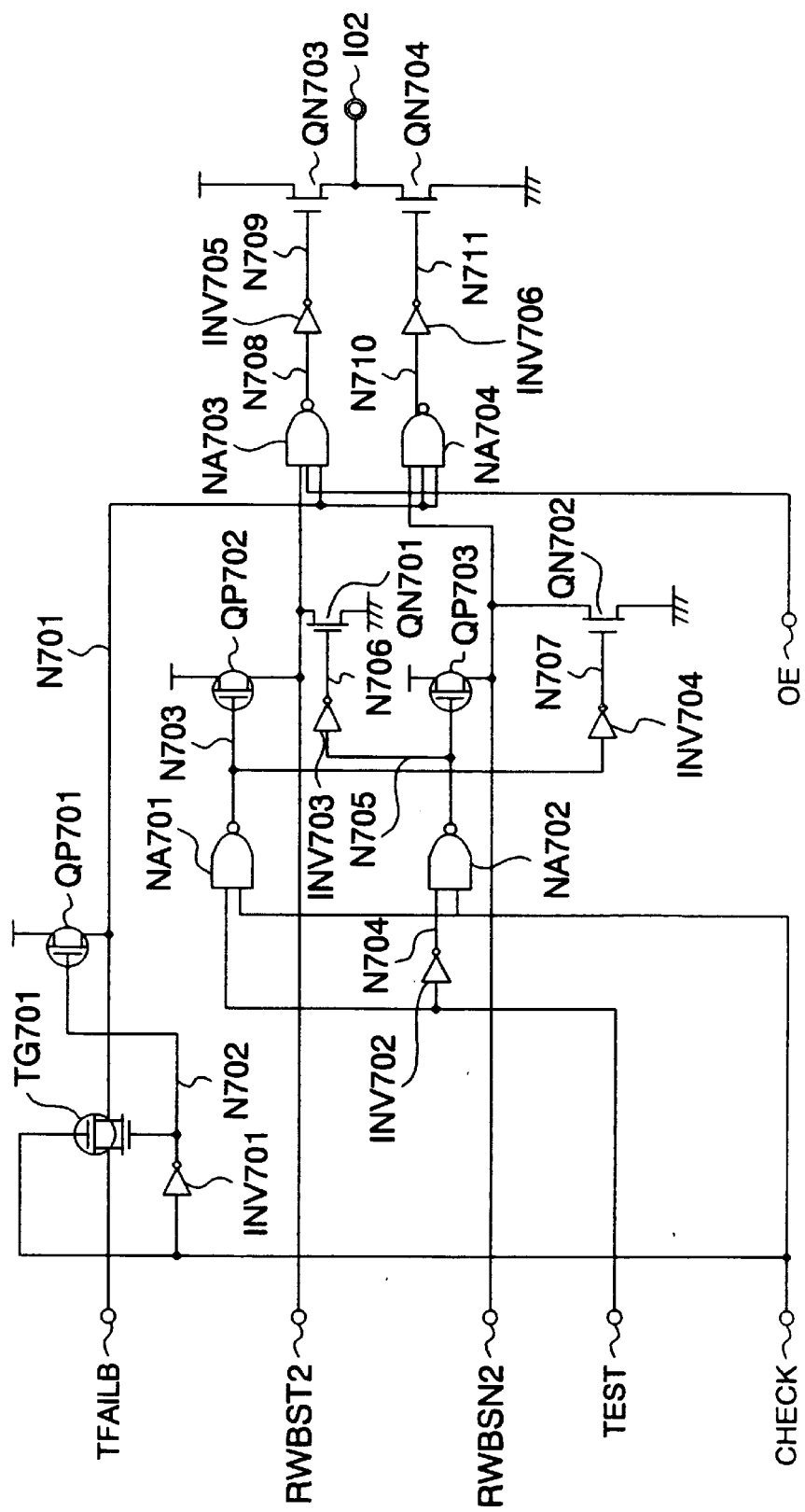
FIG. 11 is a circuit diagram of data-out buffer DOB2 in FIG. 10.

The circuit arrangement of data-out buffer DOB2 in FIG. 10 is shown in FIG. 11. wherein data-out buffer DOB2 comprises NAND gates NA703/NA704 which receive TFAILB signal through a transfer gate TG701, output enable signal OE and data from read/write bus RWBST2/RWBSN2, inverters INV705 and INV706 which receive outputs from NAND gates NA703 and NA704, respectively, and serial N-ch transistors QN703 and QN704 in an output stage which receive outputs from inverters INV705 and INV706, respectively, at their gates to output data from IO2 pin. Transfer gate TG701, which is controlled by CHECK signal, is connected in the path of TFAILB signal. A P-ch transistor QP701 which receives an inverted signal of CHECK signal as its gate input is connected between the output node N701 of transfer gate TG701 and tile source line.

A P-ch transistor QP702 which receives an output from a NAND gate NA701 receiving CHECK and TEST signals is connected between bus RWBST2 and the source line, and an N-ch transistor QN701 which receives an inverted output from a NAND gate NA702 receiving inverted signals of CHECK and TEST signals is connected between bus RWBST2 and tie ground. A P-ch transistor QP703 which also receives the output from NAND gate NA702 is connected between bus RWBSN2 and the source line while an N-ch transistor QN702 receiving an inverted output from NAND gate NA701 is connected between bus RWBSN2 and the ground.

The operation of the present embodiment will be described again with reference to FIG. 9. The write and read cycles during the bit-compressed test mode is similar to the first embodiment. Since CHECK signal is low during the read and write cycles, the data amplifier enable signal DE shown in FIG. 10 turns from low to high in accordance with DE0 signal, thereby activating the data amplifiers, similarly to the first embodiment, to drive the bus pair RWBSTi/RWBSNi (where i=1 to 4).

The technique of entering the check cycle of the bit-compressed test mode is also similar to the first embodiment. However, when CHECK signal turns high DE signal shown in FIG. 10 is fixed low, whereby the data amplifier is inactivated. In FIG. 11, if TEST signal is high, bus RWBST2 is high while bus RWBSN2 is low, thereby delivering high data to IO2 pin. Conversely, if TEST signal is low, low data is delivered to IO2 pin, thereby operating equivalently to the first embodiment.

Figure 3:
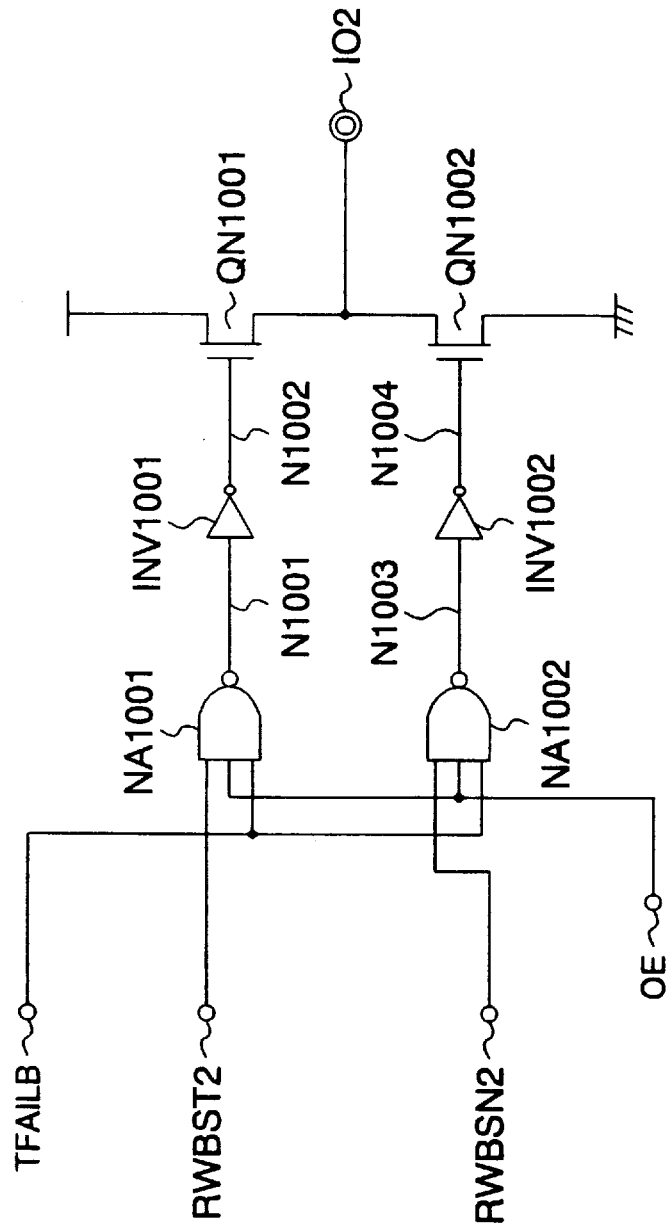
FIG. 3 is a circuit diagram of data-out buffer DOB2 in FIG. 1.

However, with this arrangement, it will be understood from the comparison of data-out buffer DOB2 of FIG. 11 against data-out buffer DOB2 shown in FIG. 3, there is no transfer gate between the bus pair RWBST/RWBSN2 and NAND gates NA703 and NA704 for data-out buffer DOB2 in FIG. 11, as well as for other data-out buffers DOBi (where i=1, 3 or 4), which eliminates a time delay caused by the transfer gate.

It will be seen from the foregoing description that, in accordance with the present invention, a determination whether or not the bit-compressed test mode is entered can be rendered using a single I/O unit which delegates a read/write operation for a plurality of I/O units, advantageously achieving an accurate screening test. This is attributable to a circuit arrangement which allows a check test mode to be entered, while continuing the bit-compressed test mode, to determine if this test mode is entered and to deliver a result of such determination to a particular I/O unit which delegates a read/write operation of a plurality of I/O units. Accordingly, a decision can be properly given to achieve a screening test accurately if a test mode devoted to the bit-compressed test mode is established and a number of products which can be tested simultaneously is increased.

Since the above embodiments are described only for examples, the present invention is not limited to the above embodiments and various modifications or alterations can be easily made therefrom by those skilled in the art without departing from the scope of the present invention.

What is claimed is:

1. A semiconductor memory device comprising a test mode selecting section for allowing the semiconductor memory device to enter a test mode for testing the semiconductor memory device, a check mode selecting section for allowing the semiconductor memory device to enter a check mode without exiting said test mode, said check mode examining whether or not the semiconductor memory device stays in the test mode, and an output section for outputting a check signal representing a result of the examination by said check mode.

2. A semiconductor memory device as defined in claim 1 wherein said test mode is a bit-compressed test mode for effecting a test for a plurality of banks of memory cells through a single I/O pin.

3. A semiconductor memory device as defined in claim 2 wherein said output section outputs said check signal though said single I/O pin.

* * * * *